(12) United States Patent
Classen et al.

(10) Patent No.: US 8,759,927 B2
(45) Date of Patent: Jun. 24, 2014

(54) HYBRID INTERGRATED COMPONENT

(71) Applicants: Johannes Classen, Reutlingen (DE); Jens Frey, Filderstadt (DE)

(72) Inventors: Johannes Classen, Reutlingen (DE); Jens Frey, Filderstadt (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/891,796

(22) Filed: May 10, 2013

(65) Prior Publication Data

US 2013/0307096 A1    Nov. 21, 2013

(30) Foreign Application Priority Data

May 14, 2012    (DE) .................. 10 2012 208 032

(51) Int. Cl.
*H04R 23/00*    (2006.01)
(52) U.S. Cl.
USPC .......... 257/418; 257/417; 257/415; 257/254; 257/253

(58) Field of Classification Search
USPC .................. 257/418, 417, 415, 253, 254
See application file for complete search history.

(56) References Cited

FOREIGN PATENT DOCUMENTS

DE    10 2007 048 604    4/2009

*Primary Examiner* — Timor Karimy
(74) *Attorney, Agent, or Firm* — Kenyon & Kenyon LLP

(57) ABSTRACT

A hybrid integrated component including an MEMS element and an ASIC element is refined to improve the capacitive signal detection or activation. The MEMS element is implemented in a layered structure on a semiconductor substrate. The layered structure of the MEMS element includes at least one printed conductor level and at least one functional layer, in which the micromechanical structure of the MEMS element having at least one deflectable structural element is implemented. The ASIC element is mounted face down on the layered structure and functions as a cap for the micromechanical structure. The deflectable structural element of the MEMS element is equipped with at least one electrode of a capacitor system. At least one stationary counter electrode of the capacitor system is implemented in the printed conductor level of the MEMS element, and the ASIC element includes at least one further counter electrode of the capacitor system.

7 Claims, 4 Drawing Sheets

HYBRID INTERGRATED COMPONENT

FIELD OF THE INVENTION

The present invention relates to a component including at least one MEMS (micro-electromechanical system) element and at least one ASIC (application specific integrated circuit) element. The functionality of the MEMS element is implemented in a layered structure on a semiconductor substrate. This layered structure includes at least one printed conductor level and at least one functional layer, in which the micromechanical structure of the MEMS element having at least one deflectable structural element is implemented. The printed conductor level is, on the one hand, insulated by at least one insulating layer from the semiconductor substrate and, on the other hand, insulated by at least one insulating layer from the functional layer. The ASIC element is mounted face down on the layered structure of the MEMS element and functions as a cap for the micromechanical structure of the MEMS element.

The MEMS element may be a sensor element having a circuit for detecting the deflection of the micromechanical structural element or also an actuator element having a circuit for activating the deflectable structural element. Circuit functions for the MEMS element are advantageously integrated on the ASIC element. That is, in the case of a sensor element, the ASIC element includes an evaluation circuit for the sensor signals and, in the case of an actuator element, the ASIC element includes an activation circuit for exciting the micromechanical structure. Of course, the ASIC element may, however, also be equipped with MEMS-independent circuit functions.

BACKGROUND INFORMATION

German Published Patent Application No. 10 2007 048 604 describes an MEMS wafer having a layered structure, in which a micromechanical structure is produced using processes of surface micromechanics.

In practice, initially a first insulating layer is applied to a semiconductor substrate for this purpose. A printed conductor level in the form of a doped and structured polysilicon layer is produced above this insulating layer. Finally, a comparatively thick epipolysilicon layer, in which the micromechanical structure of the MEMS element is implemented, is deposited as the functional layer above a further insulating layer, which is additionally used as a sacrificial layer. For this purpose, the functional layer is initially structured in order to define the geometry of the micromechanical structure. The micromechanical structure is then exposed in a sacrificial layer process, during which the further insulating layer below the micromechanical structure is removed.

An ASIC wafer is mounted on the layered structure of the MEMS wafer thus processed, specifically face down, in such a way that the surface of the ASIC wafer provided with circuit functions faces toward the MEMS wafer. In this way, both the micromechanical structure of the MEMS element and also the circuit functions of the ASIC element are capped. The connection between the MEMS wafer and the ASIC wafer is established here in a eutectic bonding process. In addition to a hermetically sealed connection between the two wafers, electrical connections may also be established between the MEMS wafer and the ASIC wafer.

The known component concept allows cost-effective mass production of robust components having a micromechanical sensor or actuator function and an evaluation or activation circuit, since here not only the individual component parts—the MEMS element and the ASIC element—are manufactured in the wafer composite, but rather also their assembly is implemented to form a component on the wafer level. The MEMS functions and the ASIC functions may be tested on the wafer level, and even the calibration of the individual components may take place on the wafer level. The stacked structure of the known components additionally contributes to a reduction of the manufacturing costs of the terminal equipment, since these components only require a comparatively small mounting area during the second level assembly.

SUMMARY

The present invention refines a hybrid integrated component including an MEMS element and an ASIC element, whose micromechanical function is based on a capacitive detection or excitation principle. In particular, measures are provided for improving the capacitive signal detection or activation.

For this purpose, the deflectable structural element of the MEMS element is equipped with at least one electrode of a capacitor system. At least one stationary counter electrode of this capacitor system is implemented in the printed conductor level of the MEMS element. According to the present invention, the capacitor system includes at least one further counter electrode, which is situated on the ASIC element.

The component according to the present invention is accordingly equipped with a differential capacitor system, whose stationary "out-of-plane" electrodes are, on the one hand, buried in the layered structure of the MEMS element and, on the other hand, implemented on the ASIC element. Therefore, a high sensitivity of the MEMS function may be achieved on a comparatively small chip area. This type of capacitor system allows the implementation of micromechanical yaw rate sensors having high vibration resistance. A high offset stability may thus be achieved in the case of micromechanical acceleration sensors.

In one particularly advantageous specific embodiment of the present invention, a layered structure having multiple circuit levels, which are electrically insulated from the semiconductor substrate of the ASIC element and from one another by insulating layers, is implemented on the upper side of the ASIC element. In the case of a CMOS wafer, these circuit levels are implemented in the form of structured metal layers of the back-end stack. The at least one further counter electrode of the capacitor system may then be implemented easily in one of the circuit levels. The uppermost circuit level suggests itself for this purpose. However, a lower-lying circuit level may also be used, if the circuit levels located above it have been appropriately structured and removed in the area of the counter electrode. In this way, the sensitivity of the capacitor system may be influenced in a targeted manner. This is because the sensitivity is substantially dependent on the electrode distances, but also on the dielectric material between the electrodes of the capacitor system, which is to be taken into consideration in particular if the one counter electrode is implemented in a lower circuit level within the layered structure of the ASIC element. In many applications, for example, in the case of inertial sensors, it is advantageous if both electrode gaps of the capacitor system are of essentially equal size, i.e., if the distance between the buried, lower electrode in the layered structure of the MEMS element and the lower side of the deflectable structural element and the distance between the upper electrode of the ASIC element and the upper side of the deflectable structural element are similar. Particularly good vibration resistance and offset stability may be achieved in this case.

In particular in the case of a component structure having small electrode gaps, it has proven to be advantageous if at least one electrode area in the uppermost circuit level of the ASIC element is used as a mechanical stop for the deflectable structural element of the MEMS element. The ASIC element forms a mechanical overload protection for the micromechanical structure of the MEMS element in this case. In order to prevent a short-circuit between the circuit functions of the ASIC element and the micromechanical structure of the MEMS element in the case of an overload situation, the electrode area used as a mechanical stop is interconnected in such a way that it is at the same electrical potential as the micromechanical structure of the MEMS element. This may be implemented easily due to the very flexible wiring possibilities of the circuit levels of the ASIC element.

The flexible wiring possibilities of the circuit levels of the ASIC element are also used in another specific embodiment of the present invention, specifically to electrically connect spatially separated areas of the printed conductor level of the MEMS element via connecting areas in the function layer and at least one circuit level of the ASIC component. This has proven to be advantageous in multiple aspects. Printed conductors in the printed conductor level of the MEMS element have a minimum width of 30 µm-40 µm and therefore a high space requirement and high parasitic capacitances. In contrast thereto, printed conductor widths in the order of magnitude of 1 µm may be implemented without problems in the circuit levels of the ASIC element. Accordingly, by using the wiring possibilities of the ASIC element for the wiring of circuit elements in the printed conductor level of the MEMS element, the parasitic capacitances, the connecting resistances, and the space requirement for this wiring may be significantly reduced.

As already mentioned, the sensitivity of the capacitor system is substantially dependent on the distance between the movable electrodes and the stationary electrodes. The smaller are these distances, the greater the sensitivity. Accordingly, the requirement for the highest possible sensitivity is opposed to the "out-of-plane" mobility of the micromechanical structure. In particular in the case of asymmetrically suspended structural elements and with suitable electrode arrangement on the deflectable structural element of the MEMS element and on the ASIC element, both requirements may be taken into consideration, in that at least one recess for the deflectable structural element of the MEMS element is implemented in the upper side of the ASIC element.

The distance between the electrode on the deflectable structural element of the MEMS element and the stationary electrode on the ASIC element is substantially dependent on the type of mounting of the ASIC element on the MEMS element. As already mentioned, bonding processes are preferably used here, since not only hermetically sealed and very mechanically stable and durable connections may be established using this process, but rather also electrical connections may be established between the elements. For this purpose, metallic bonding materials are frequently applied to the connecting surfaces, which then form a eutectic connection in the course of a heat treatment. The thickness of the resulting connecting layer determines the distance between the MEMS element and the ASIC element and accordingly also the electrode distance.

One possibility for reducing this mounting-related electrode distance is to place the connecting material in a recess in the upper side of the ASIC element and/or in a recess in the upper side of the MEMS element. In certain cases, however, it may also be advisable to increase the mounting-related electrode distance. For this purpose, the functional layer of the MEMS element may also be thinned back in the area of the micromechanical structure.

The concept according to the present invention is suited in particular for implementing hybrid integrated sensor components which operate in a contactless manner, for example, inertial sensor components, since the sensor structure is enclosed hermetically between the MEMS substrate and the ASIC cap here, and is thus protected from soiling and an aggressive measuring environment. In the case of an inertial sensor component, the micromechanical structure of the MEMS element includes at least one resiliently suspended seismic mass as the deflectable structural element. The mobility of the seismic mass is ensured here on the substrate side by the removal of the sacrificial layer and on the ASIC side by a connecting layer between the MEMS element and the ASIC element. The activation or evaluation circuit for the MEMS element is advantageously integrated into the ASIC substrate.

DETAILED DESCRIPTION

Figure 1A:
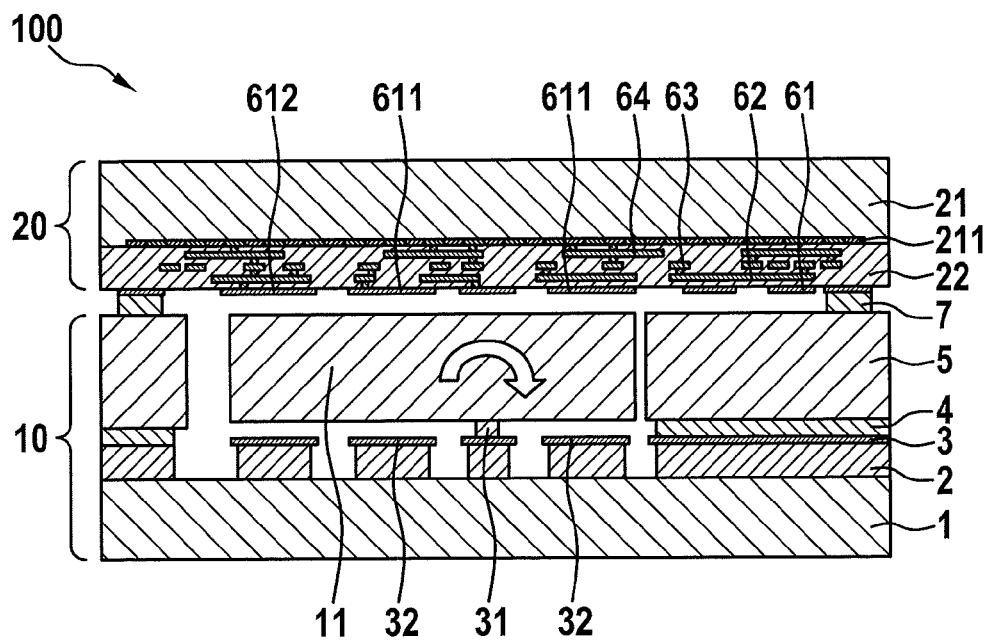
FIGS. 1a, 1b, and 2 through 6 each show a schematic sectional view of a component according to the present invention for detecting z-accelerations.
Figure 1B:
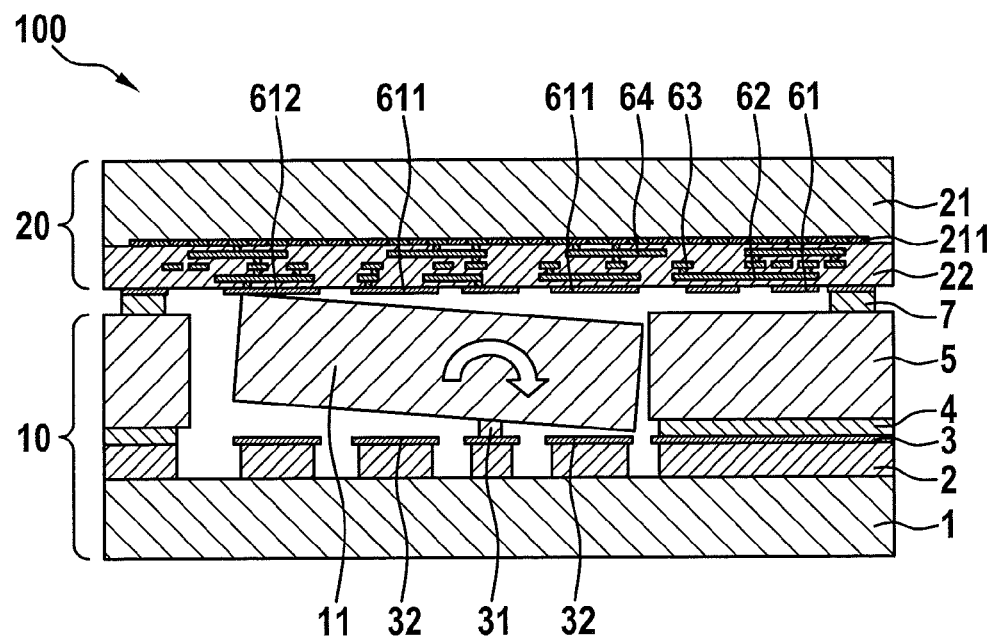

Sensor component 100 shown in FIGS. 1a and 1b essentially includes an MEMS element 10 and an ASIC element 20. The functionality of MEMS element 10 is implemented in a layered structure on a semiconductor substrate 1. This may be a silicon substrate, for example. The layered structure includes a printed conductor level 3 and a functional layer 5. Printed conductor layer 3 is implemented here in the form of a doped polysilicon layer, which was deposited on semiconductor substrate 1 above a first insulating layer 2 made of silicon oxide. Individual areas of printed conductor level 3 were spatially separated from one another by structuring of polysilicon layer 3, to thus produce printed conductors, a terminal area 31 for the micromechanical sensor structure, and also two stationary electrodes 32 of a measuring capacitor system. The two stationary electrodes 32 of the measuring capacitor system are situated symmetrically on both sides of terminal area 31. Another oxide layer 4 was then initially produced and structured above printed conductor level 3 thus structured, before a thick epipolysilicon layer 5 was deposited as the functional layer on the layered structure. Oxide layer 4 is used here as the electrical insulation between printed conductor level 3 and functional layer 5, but also as a sacrificial layer, sections of which were removed after the structuring of functional layer 5, to expose micromechanical sensor structure 11 thus produced in functional layer 5. The thickness of sacrificial layer 4 accordingly determines the distance between micromechanical sensor structure 11 and electrodes 32 in printed conductor level 3. Typical distances between micromechanical sensor structure 11 and printed conductor level 3 are 0.5 µm to 3 µm, preferably 1.0 µm to 2.0 µm. In the exemplary embodiment described here, the micromechanical sensor structure is implemented in the form of an asymmetrically mounted, rocker-shaped seismic mass 11, which is mechanically and electrically connected to terminal area 31 of printed conductor level 3. Seismic mass 11 functions as the movable electrode of the measuring capacitor system. FIG. 1a shows seismic mass 11 in the rest position; seismic mass 11 is maximally deflected in FIG. 1b. The rocker movement of seismic mass 11 is indicated by an arrow.

ASIC element 20 is mounted face down on the layered structure of MEMS element 10 in such a way that ASIC element 20 forms a cap for the sensor structure of MEMS element 10 and seismic mass 11 is enclosed in a hermetically sealed manner between MEMS substrate 10 and ASIC element 20. The mechanical and electrical connection between the two elements 10 and 20 was established here in a bonding process using metallic connecting materials 7. Since the ASIC-side bond pads are implemented in uppermost circuit level 61 of ASIC element 20 and the MEMS surface has no depressions in the bond area, the thickness of connecting layer 7 determines the distance between the two elements 10 and 20. Vias and rear side contacts in ASIC element 20 are not shown here or in the remaining figures.

ASIC element 20 includes a starting substrate 21, in which at least parts of a signal processing and evaluation circuit 211 for the MEMS sensor function of component 100 were integrated into a CMOS process. Starting substrate 21 was then provided with a multilayered metallization for the rewiring of the circuit functions. For this purpose, a layered structure which includes multiple structured metal layers as circuit levels 61, 62, 63, . . . was produced on starting substrate 21. The circuit levels are connected to one another and/or to electrical circuit elements 211 by connecting lines, but are otherwise spatially and electrically separated from one another and from starting substrate 21 by insulating layers. Since the insulating layers in the exemplary embodiment described here are each an oxide layer, a differentiation is not made hereafter between individual insulating layers. Rather, together they form one insulating layer 22, in which circuit levels 61, 62, 63 . . . are embedded. In the exemplary embodiment described here, two further stationary counter electrodes 611 of the measuring capacitor system are implemented in uppermost circuit level 61 of ASIC element 20. These two counter electrodes 611 are situated opposite to stationary electrodes 32 in printed conductor level 3. The distance of counter electrodes 611 to seismic mass 11 of MEMS element 10 is determined by the mounting distance, i.e., the thickness of connecting layer 7, which essentially corresponds to the distance between printed conductor level 3 and seismic mass 11 in the case of sensor component 100. Such a mounting distance may be achieved, for example, using eutectic bonding processes, such as Al—Ge, or also in a metallic thermocompression bonding process, such as Au—Au.

Accordingly, the measuring capacitor system of sensor component 100 thus includes three electrode levels, specifically printed conductor level 3 having stationary electrodes 32, functional layer 5 having seismic mass 11 as a deflectable electrode, and first circuit level 61 of ASIC element 20 having the two stationary counter electrodes 611, the two levels having stationary electrodes 32 and 611 being situated symmetrically to seismic mass 11. The deflections of seismic mass 11 may be detected using this measuring capacitor system on both sides of the rocker structure as a capacitance difference in each case. This fully differential measured value detection proves to be advantageous, for example, if mounting-related or thermally related mechanical tensions occur within the component, which result in a deflection of rocker-shaped seismic mass 11 from the original rest position. In measuring capacitor systems having three electrode levels, the impact of these effects on the sensor signal may be eliminated for the most part, since the electrode gap increases on the one side of seismic mass 11 to the same extent as the electrode gap decreases on the other side of seismic mass 11. The symmetry of the capacitor system additionally offers performance advantages with regard to the vibration resistance and the offset stability of the sensor signal.

Furthermore, in the exemplary embodiment described here, a mechanical stop 612 for seismic mass 11 is implemented in uppermost metal level 61 of ASIC element 20, which is illustrated in particular by FIG. 1b. This mechanical stop 612 is used as an overload protection for the micromechanical sensor structure. It was set with the aid of the wiring of ASIC element 20 to the same electrical potential as seismic mass 11 in such a way that in case of an overload situation, a short-circuit cannot occur between the micromechanical sensor structure and the circuit functions of ASIC element 20.

Figure 2:
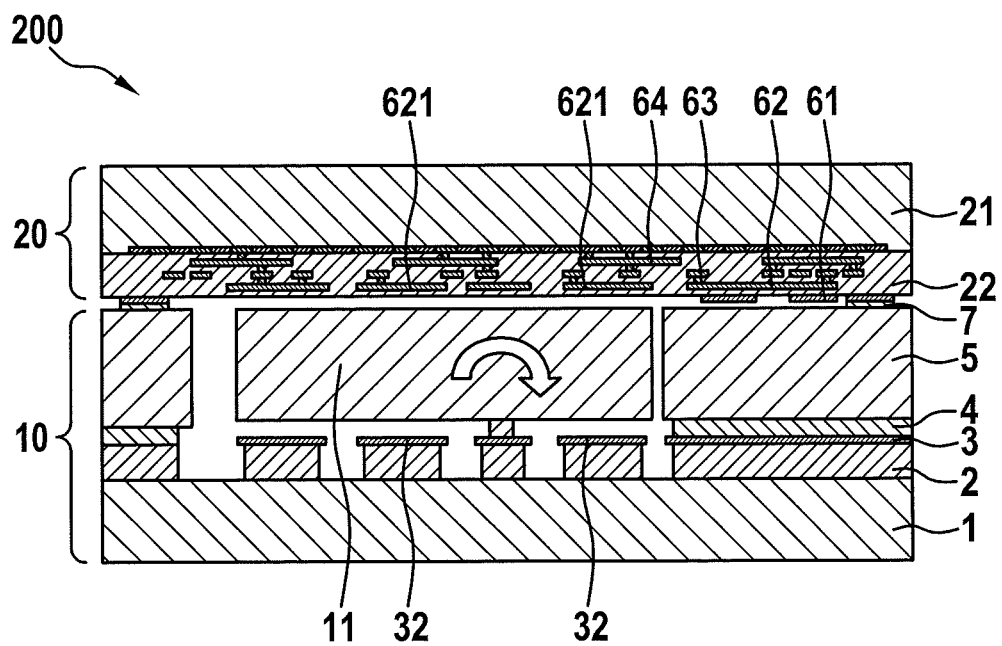

Connecting layer 7 between MEMS element 10 and ASIC element 20 of sensor component 200 shown in FIG. 2 is significantly thinner than in the case of above-described sensor component 100, while sacrificial layer 4 is approximately of equal thickness in both cases. Accordingly, the distance between the two elements 10 and 20 in the case of sensor component 200 is less than the distance between seismic mass 11 and printed conductor level 3. In order to nonetheless approximate a symmetrical electrode system, ASIC-side stationary counter electrodes 621 of sensor component 200 shown in FIG. 2 are not implemented in uppermost circuit level 61 of ASIC element 20, but rather in second circuit level 62. In addition, counter electrodes 621 are completely embedded in insulating layer 22 here.

Since sensor component 200 shown in FIG. 2 otherwise does not differ from sensor component 100, reference is made with regard to the remaining components to the explanations of FIG. 1.

It is also to be noted here that it may also be advantageous for special applications to implement different electrode gaps in one component. The ASIC-side "out-of-plane" electrodes may also be implemented easily in a lower-lying metal level of the ASIC back-end stack in this case. For this purpose, the metal levels lying above it are locally removed during the manufacturing process. If oxide layers having a relatively high dielectric constant are still located above this lower-lying metal level, a series circuit of capacitances having a total capacitance which is still quite high results for capacitive sensors. Therefore, such a system results at most in a moderate reduction of the sensitivity of the capacitor system.

Figure 3:
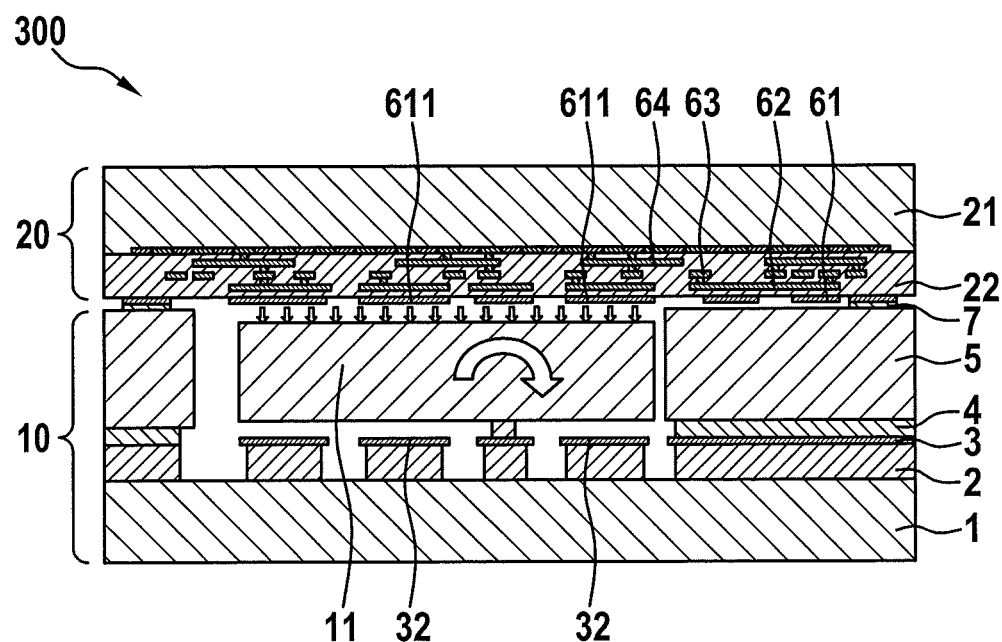

FIG. 3 illustrates another possibility for calibrating the upper and lower electrode gaps of the capacitor system if connecting layer 7 between MEMS element 10 and ASIC element 20 is significantly thinner than sacrificial layer 4. In the case of sensor component 300, seismic mass 11 was thinned back locally, to increase the distance between seismic mass 11 and stationary counter electrodes 611 in uppermost circuit level 61 of ASIC element 20 and to calibrate it to the distance between seismic mass 11 and electrodes 32 in printed conductor level 3. This structuring of functional layer 5 of MEMS element 10, which is emphasized here by arrows, was carried out before the wafer bonding process.

It is also to be noted here that, alternatively, elevations may also be produced in the area of the bond connection in such a structuring process for the calibration of upper and lower electrode gaps. Instead of the MEMS surface or in addition thereto, the ASIC surface may also be provided with a corresponding structure.

Since sensor component 300 shown in FIG. 3 otherwise does not differ from sensor component 100, reference is made with regard to the remaining components to the explanations of FIG. 1.

Figure 4:
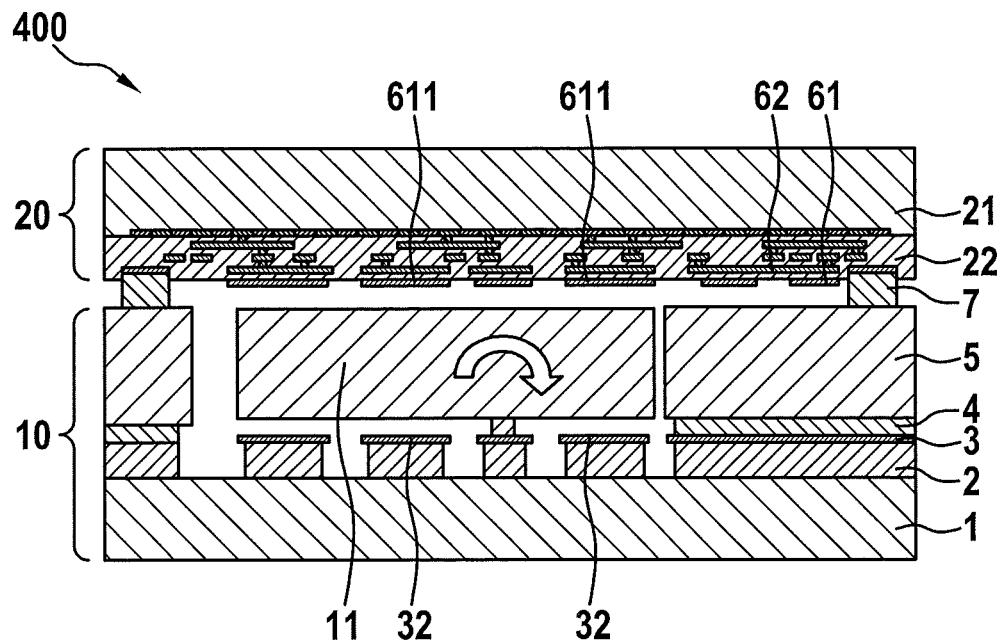

In the case of sensor component 400 shown in FIG. 4, connecting layer 7 between MEMS element 10 and ASIC element 20 is significantly thicker than the distance between seismic mass 11 and stationary electrodes 32 in printed conductor level 3. In order to nonetheless approximate a symmetrical electrode system, the bond connection was placed on a lower metal level, second metal level 62 here, while ASIC-side stationary counter electrodes 621 are implemented in uppermost circuit level 61. Additionally or also alternatively to the structuring of the ASIC surface required for this purpose, the MEMS surface may also be provided with one or multiple depression(s) in the bond area, to calibrate the upper electrode gap to the lower electrode gap.

Since sensor component 400 shown in FIG. 4 otherwise does not differ from sensor component 100, reference is made with regard to the remaining components to the explanations of FIG. 1.

Figure 5:
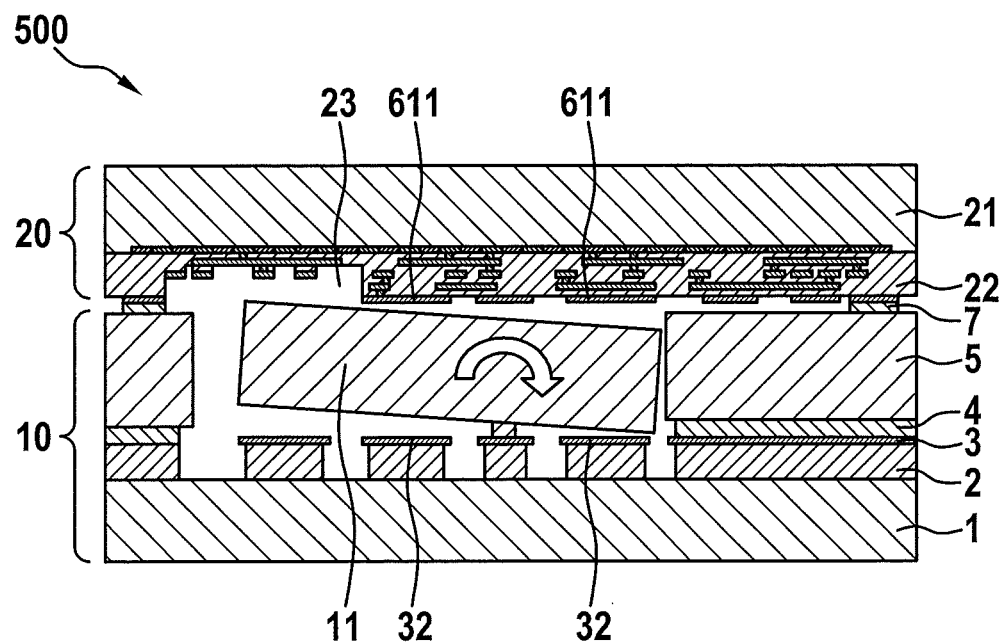

FIG. 5 illustrates that structuring of the ASIC surface may also be meaningful for other reasons. Thus, a recess 23 is located in the ASIC surface of sensor component 500 shown here, whereby the movement freedom of the longer end of asymmetrically mounted seismic mass 11 is increased. The signal detection also takes place here with the aid of a capacitor system, whose stationary electrodes 32 and 611 are situated at a relatively small distance to the axis of torsion of seismic mass 11.

Reference is made to the explanations of FIG. 1 with regard to the remaining components of sensor component 500.

Figure 6:
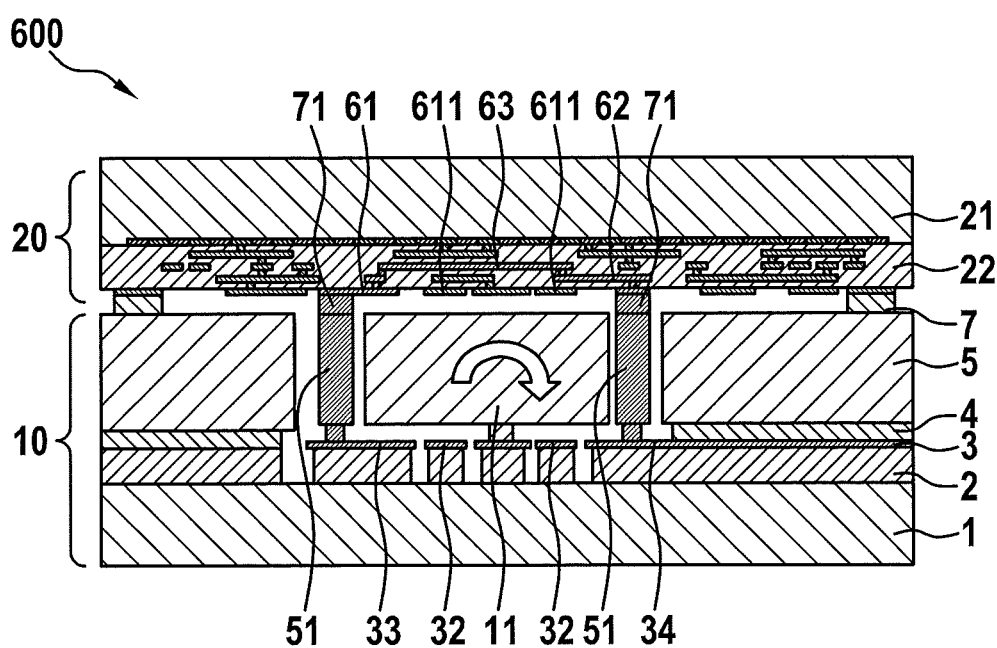

FIG. 6 illustrates that the circuit levels of ASIC element 20 may also be used for wiring areas of printed conductor level 3 of MEMS element 10 which are electrically and spatially separated from one another, which has a significantly greater space-saving effect in comparison to a wiring in printed conductor level 3. In the case of sensor component 600, the two areas 33 and 34 of printed conductor level 3, which are used as the lower stop areas for seismic mass 11, are electrically connected via circuit levels 61, 62, and 63 of ASIC element 20 in such a way that they lie at the same electrical potential. The electrical connection is established via connecting areas 51 in functional layer 5, which are insulated by trenches in relation to the adjoining epipolysilicon. These connecting areas 51 are electrically connected via bond connections 71 to uppermost circuit level 61 or second circuit level 62 and are electrically connected via third circuit level 63 of ASIC element 20.

What is claimed is:

1. A component, comprising:
    a semiconductor substrate;
    at least one MEMS element having a micromechanical structure that includes at least one deflectable structural element, the MEMS element being implemented in a layered structure on the semiconductor substrate, wherein the layered structure includes:
        at least one printed conductor level, and
        at least one functional layer in which the micromechanical structure including the deflectable structural element is implemented;
    at least one ASIC element mounted face down on the layered structure of the MEMS element and functioning as a cap for the micromechanical structure of the MEMS element;
    at least one first insulating layer from the semiconductor substrate that insulates the printed conductor level; and
    at least one second insulating layer from the functional layer that insulates the printed conductor level, wherein:
        the deflectable structural element of the MEMS element is equipped with at least one electrode of a capacitor system,
        at least one stationary counter electrode of the capacitor system is implemented in the printed conductor level of the MEMS element, and
        the ASIC element includes at least one further counter electrode of the capacitor system.

2. The component as recited in claim 1, further comprising:
    a further semiconductor substrate associated with the ASIC element; and
    a further layered structure including multiple circuit levels electrically insulated by further insulating layers from the further semiconductor substrate of the ASIC element and from one another, wherein:
        the further layered structure is implemented on an upper side of the ASIC element, and
        the at least one further counter electrode of the capacitor system is implemented in one of the circuit levels.

3. The component as recited in claim 2, wherein:
    at least one electrode area of a circuit level of the ASIC element is a mechanical stop for the deflectable structural element of the MEMS element, and
    the electrode area is interconnected in such a way that the electrode area is at the same electrical potential as the micromechanical structure of the MEMS element.

4. The component as recited in claim 2, further comprising:
    connecting areas disposed in the functional layer, wherein spatially separated areas of the printed conductor level of the MEMS element are electrically connected via the connecting areas and at least one circuit level of the ASIC element.

5. The component as recited in claim 1, wherein at least one recess for the deflectable structural element of the MEMS element is implemented in an upper side of the ASIC element.

6. The component as recited in claim 1, further comprising:
    at least one connecting material, wherein:
        the ASIC element is mounted via the connecting material on the layered structure of the MEMS element, and
        the connecting material is placed at least one of in a recess in an upper side of the ASIC element and in a recess in an upper side of the MEMS element.

7. The component as recited in claim 1, wherein the functional layer of the MEMS element is thinned back in an area of the micromechanical structure.

* * * * *